(12) United States Patent
Costa et al.

(10) Patent No.: US 7,253,656 B2
(45) Date of Patent: Aug. 7, 2007

(54) CALIBRATION CIRCUIT FOR A DRIVER CONTROL CIRCUIT, AND DRIVER CONTROL CIRCUIT

(75) Inventors: Vincenzo Costa, Assling (DE); Christian Müller, Woerth (DE)

(73) Assignee: Infineon Technologies, Munich (DE)

( * ) Notice: Subject to any disclaimer, the term of this patent is extended or adjusted under 35 U.S.C. 154(b) by 87 days.

(21) Appl. No.: 11/226,901

(22) Filed: Sep. 14, 2005

(65) Prior Publication Data
US 2006/0061387 A1 Mar. 23, 2006

(30) Foreign Application Priority Data
Sep. 14, 2004 (DE) .................. 10 2004 044 422

(51) Int. Cl.
*H03K 17/16* (2006.01)
*H03K 19/0175* (2006.01)

(52) U.S. Cl. ......................... 326/30; 326/82

(58) Field of Classification Search ................. 326/30, 326/82, 83, 86, 87; 327/108
See application file for complete search history.

(56) References Cited

U.S. PATENT DOCUMENTS

| | | | |
|---|---|---|---|
| 5,166,550 A * | 11/1992 | Matsubara et al. | 327/68 |
| 6,556,039 B2 * | 4/2003 | Nagano et al. | 326/30 |
| 6,636,821 B2 | 10/2003 | Lawson | |
| 6,836,170 B2 * | 12/2004 | Kitagawa et al. | 327/308 |
| 7,038,486 B2 * | 5/2006 | Aoyama et al. | 326/30 |
| 2002/0175700 A1 * | 11/2002 | Nagano et al. | 326/30 |
| 2004/0021481 A1 * | 2/2004 | Ohno | 326/30 |
| 2004/0165693 A1 * | 8/2004 | Lee et al. | 377/94 |

FOREIGN PATENT DOCUMENTS

| | | |
|---|---|---|
| EP | 0 978 943 A2 | 2/2000 |
| EP | 1 111 790 A1 | 6/2001 |

* cited by examiner

*Primary Examiner*—Rexford Barnie
*Assistant Examiner*—Thienvu V. Tran
(74) *Attorney, Agent, or Firm*—Maginot, Moore & Beck

(57) ABSTRACT

A calibration circuit of a driver control circuit which controls a plurality of input/output drivers of an integrated circuit comprises first and second voltage/current converters, first, second and third comparators and a voltage/current converter circuit. The first voltage/current converter with an external resistor provides a reference voltage to half the value of a supply voltage of the calibration circuit. The second voltage/current converter is connected to a first pull-down driver whose pull-down driver voltage is set to half the supply voltage. The second comparator compares the reference voltage with the pull-down driver voltage to provide a first calibration signal. The voltage/current converter circuit is connected to a pull-up driver whose pull-up voltage is set to half the value of the supply voltage. The third comparator compares the reference voltage with the pull-up driver voltage in order to provide a second calibration signal.

16 Claims, 7 Drawing Sheets

CALIBRATION CIRCUIT FOR A DRIVER CONTROL CIRCUIT, AND DRIVER CONTROL CIRCUIT

BACKGROUND OF THE INVENTION

1. Field of the Invention

The invention relates to a calibration circuit for reducing a respective calibration error of a first calibration signal for a pull-down driver and a second calibration signal for a pull-up driver of a driver control circuit for controlling N input/output drivers of an integrated circuit and to such a driver control circuit.

2. Description of the Prior Art

The technical field of the invention relates to the transmission of signals from a microchip to other components or microchips by means of output lines or microchip output lines. An individual microchip has a multiplicity of output lines. The signals that are transmitted via the output line of the microchip are driven by means of an input/output driver (I/O driver). In order to minimize or to avoid the reflection of transmitted signal energy on an output line, thus reducing or avoiding noise on the output line, the output resistance of the input/output drivers is to be matched to the resistance of the output lines. Since the output resistance of the input/output drivers is subject to severe fluctuations both on account of the production tolerances and on account of the respective operating conditions, regulating the output resistance of the input/output driver to the resistance of the output line is a difficult technical problem of regulation. Since the input/output drivers on a microchip are subject to the same production conditions, an individual driver control circuit suffices for controlling all the input/output drivers of said microchip in such a way that the output resistance of the input/output drivers is in each case matched to the resistance of the corresponding output line.

In regard to this, FIG. 1 shows a schematic block diagram of a microchip with a known driver control circuit for controlling the input/output drivers. A microchip MC has a multiplicity of input/output drivers EAT. Without restricting the generality, two input/output drivers EAT-1, EAT-2 are illustrated in FIG. 1. The input/output driver EAT-1 is connected to the microchip output line MCA-1 on the output side, so that signals transmitted on the microchip output line MCA-1 are driven by the input/output driver EAT-1. On the input side, the input/output driver EAT-1 is connected to a multiplicity of driver input lines TE. Without restricting the generality, four driver input lines TE-1, . . . , TE-4 are illustrated in FIG. 1. The driver input lines TE-1, . . . , TE-4 are coupled to the calibration circuit output lines KSA-1, . . . , KSA-4 of a driver control circuit TSS. For controlling the input/output drivers EAT, the driver control circuit TSS transmits a control signal to the output/input drivers EAT. By way of example, the control signal for the input/output driver EAT-1 is transmitted via the calibration circuit output line KSA-1, . . . , KSA-4 and via the driver input lines TE-1, . . . , TE-4. According to the example shown in FIG. 1, the control signal is formed by four control bits, namely the first control bit b1, the second control bit b2, the third control bit b3 and the fourth control bit b4. By way of example, the first control bit b1 is transmitted via the calibration circuit output line KS-1 and the driver input line TE-1 to the input/output driver EAT-1 and to the input/output driver EAT-2.

FIG. 2 shows a schematic block diagram of the known driver control circuit TSS for generating a control signal SS for the input/output drivers EAT. The driver control circuit TSS has an input/output driver EAT, the properties of which correspond to those of the input/output drivers that are provided at the edge of the microchip MC and are connected to the microchip output lines MCA. The output resistance of the input/output driver EAT of the driver control circuit TSS cannot be matched to the resistance of the output lines MCA in continuous steps, but rather only in discrete steps by means of the four control bits b1, . . . , b4. The above will be explained by means of a detailed circuit analysis:

The driver control circuit TSS has an external resistor W-2 having a resistance value Z corresponding to the resistance value of the microchip output line MCA.

After the external resistor W-2 has been connected up to the input/output driver EAT via a first node KN-1 between a supply voltage VS and earth, the input/output driver EAT is used as a pull-down driver. In order that the input/output drivers EAT connected to the output lines of the microchip are also provided with a control signal for their pull-up drivers, a second driver control circuit TSS with a further external resistor W-2 is necessary (not shown). The regulation voltage RS can be tapped off at the first node KN-1, which voltage is to be regulated to half a supply voltage VS/2. If the regulation voltage RS has the value of half the supply voltage VS/2, then the output resistance of the input/output driver is equal to the external resistor W-2, and the regulation aim is fulfilled.

Details will now be given about regulating the regulation voltage RS to half the supply voltage VS-2 in order to set the output resistance of the input/output driver of the driver control circuit TSS to the resistance value Z of the external resistor W-2.

Half the supply voltage VS/2 is provided at a second node KN-2 by means of a voltage divider ST. The voltage divider ST comprises a series circuit of two first resistors W-1 having identical first resistance values R1. The second node KN-2 serves for tapping off half the supply voltage VS/2 between the two first resistors W-1.

The driver control circuit TSS furthermore has a comparator K. The comparator K receives half the supply voltage VS/2 and the regulation voltage RS on the input side. The comparator K compares the regulation voltage RS with half the supply voltage VS/2. The result of this comparison is a voltage difference $\Delta V$.

The voltage divider ST, the comparator K, the external resistor W-2 and the input/output driver of the driver control circuit TSS form a calibration circuit KS. The output resistance of the input/output driver EAT is set by means of the calibration circuit KS.

For this purpose, the calibration circuit KS receives a regulating signal form a control signal generating circuit SSG. According to the example in accordance with FIG. 2, the regulating signal is formed by four control bits, namely the first control bit b1, the second control bit b2, the third control bit b3 and the fourth control bit b4.

On the input side, the control signal generating circuit SSG receives the voltage difference $\Delta V$ and generates therefrom a control signal SS for the input/output drivers connected to the output lines of the microchip, and the regulating signal for the calibration circuit KS.

The control signal generating circuit SSG has an automatic state machine ZA, a detection circuit DS and a storage device S. The automatic state machine ZA internally manages a number of $2^n$ different states. A state corresponds to a regulating signal for the output resistance of the input/output driver EAT of the driver control circuit TSS. According to the example in accordance with FIG. 2, the automatic state machine has $2^4$ different states and accordingly four output lines on which the first control bit b1, the second control bit b2, the third control bit b3 and the fourth control bit b4 are transmitted on the one hand to the calibration circuit KS as regulating signal and on the other hand to the storage device S.

The respective present state, formed by the four control bits b1, b2, b3, b4 is buffer-stored in the storage device S.

The detection circuit DS receives the voltage difference ΔV on the input side. Depending on the voltage difference ΔV, the detection circuit DS detects the settled state of the regulation. The settled state of the regulation is achieved when the sign of the voltage difference ΔV changes alternately. Thus, if the settled state has been reached, the detection circuit DS transmits a selection signal AS to the storage device S and enables the presently stored state in the storage device S in order to be transmitted as control signal SS to the input/output drivers of the microchip as pull-down control signal.

The following problems arise in the case of the known driver control circuit TSS. A respective driver control circuit TSS with an external resistor W-2 is to be provided for the pull-up drivers and for the pull-down drivers. External resistors are very expensive to use on account of their space requirement and the packing complexity within the circuit, the high accuracy required and the additional installation outlay. Moreover, the inaccuracy of the regulation is high on account of the discrete steps for setting the output resistance for the input/output driver EAT of the driver control circuit TSS.

In order to elucidate this problem area, FIG. 3 illustrates a schematic diagram showing the regulation error F produced by the known driver control circuit. Let us assume that the automatic state machine ZA has $2^4=16$ internal states, as illustrated in FIG. 2, and the resistance value Z has a value of between 20Ω and 80Ω. The range in which the resistance value Z of the microchip output line fluctuates is 60Ω in this example. With the 16 steps of the automatic state machine ZA in accordance with FIG. 2, a resistance step ΔR of 3.75Ω results (cf. equation (I)).

$$\Delta R = \frac{60\,\Omega}{2^n} = \frac{60\,\Omega}{2^4} = 3.75\,\Omega \tag{I}$$

On account of this resistance step ΔR and this resistance range for the external resistance value Z, this results in a maximum regulation error Fmax of:

$$F\max = \frac{3.75\,\Omega}{50\,\Omega} = 7.5\% \tag{II}$$

The regulation error F is very high and noise on the output lines on account of the reflection of the transmitted signal energy can be reduced only to a very limited extent.

SUMMARY OF THE INVENTION

It is an object of the present invention to control the input/output drivers of a microchip cost-effectively in such a way that noise is minimized during the transmission of signals by the input/output drivers via the microchip output lines.

The object is achieved in accordance with the invention by means of a calibration circuit for reducing a respective calibration error of a first calibration signal for a pull-down driver and a second calibration signal for a pull-up driver of a driver control circuit for controlling N input/output drivers of an integrated circuit, the calibration circuit having being comprised of an external resistor, which has a resistance value of the output line of the integrated circuit;

a first voltage/current converter, which is connected to the external resistor by means of a first node, the first voltage/current converter being connected to a supply voltage and the external resistor being connected to earth, so that a reference voltage is dropped across the first node;

a first comparator, which compares the reference voltage with half the supply voltage in order to provide a first amplified differential voltage on the output side, the first voltage/current converter converting the first amplified voltage difference into a first current, so that the first voltage/current converter regulates the reference voltage to half the supply voltage;

a second voltage/current converter, which is connected to the pull-down driver via a second node and which converts the first amplified differential voltage into the first current in order to set a pull-down driver voltage to half the supply voltage;

a second comparator, which compares the reference voltage with the pull-down driver voltage in order to provide the first calibration signal on the output side;

a voltage/current converter circuit, which is connected to the pull-up driver via a third node and which converts the first amplified differential voltage into the negative first current in order to set a pull-up driver voltage to half the supply voltage; and comprising a third comparator, which compares the reference voltage with the pull-up driver voltage in order to provide the second calibration signal on the output side.

The object is also achieved in accordance with the invention by means of a driver control circuit for controlling N input/output drivers of the integrated circuit, the driver control being comprised of:

a calibration circuit having the features described above;

a first control signal generating circuit, which receives the reference voltage, the first calibration signal and the pull-down driver voltage and generates therefrom a first regulating signal for regulating the pull-down driver voltage of the pull-down driver to the reference voltage and a first control signal for controlling the pull-down drivers of the N input/output drivers; and a second control signal generating circuit, which receives the reference voltage, the second calibration signal and the pull-up driver voltage and generates therefrom a second regulating signal for regulating the pull-up driver voltage of the pull-up driver to the reference voltage and a second control signal for controlling the pull-up drivers of the N input/output drivers.

The resistance value of the external resistor need not definitely correspond to the resistance value of the output line. All that is necessary is the condition that both resistance values are directly proportionally dependent on one another. The voltage/current conversion characteristic of the voltage/current converters would then have to be adapted correspondingly.

In accordance with one preferred embodiment of the invention, the voltage/current converter circuit has:

a third voltage/current converter, which is connected to the supply voltage and, via a fourth node, to an earthed fourth voltage/current converter, so that a first voltage is dropped across the fourth node;

a fourth comparator, which compares the reference voltage with the first voltage in order to provide a second amplified differential voltage on the output side, the fourth current/voltage converter receiving the second amplified differential voltage on the input side and thus setting the first voltage to half the supply voltage; and a fifth voltage/current converter, which has an identical voltage/current conversion characteristic to the fourth voltage/current converter and also receives the second amplified differential voltage and converts its into the negative first current.

In accordance with a further preferred embodiment of the inventive circuit, the first current flows from the second voltage/current converter into the second node and from the fifth voltage/current converter into the third node.

In accordance with a further preferred embodiment of the inventive circuit, the first voltage/current converter, the second voltage/current converter and the third voltage/current converter have an identical voltage/current conversion characteristic.

In accordance with a further preferred embodiment of the inventive circuit, half the supply voltage is provided by means of a fourth voltage divider having a first resistor and a second resistor having identical resistance values.

In accordance with one preferred embodiment of the inventive circuit of the inventive driver control circuit, the first control signal generating circuit and the second control signal generating circuit in each case have an automatic state machine, which, on the input side, receives the corresponding calibration signal and, on the output side, depending on the corresponding calibration signal, provides one of its $2^n$ predefined states by means of n control lines, the automatic state machine providing, on each of the n control lines, precisely one control bit according to the present state of the $2^n$ states.

In accordance with a further preferred embodiment of the inventive circuit, the automatic state machine assumes the next higher state if the calibration signal is positive, and assumes the next lower state if the calibration signal is negative.

In accordance with a further preferred embodiment of the inventive circuit, the first control signal generating circuit and the second control signal generating circuit in each case have a detection circuit, which detects a settled state of the automatic state machine by means of the calibration signal.

In accordance with a further preferred embodiment of the inventive circuit, the first control signal generating circuit and the second control signal generating circuit in each case have a first storage device and a second storage device, both the first storage device and the second storage device being connected to the n control lines.

In accordance with a further preferred embodiment of the inventive circuit, the detection circuit, in the case of the detection of the settled state, triggers by means of a first selection signal the storage of n control bits that represent the higher state of the settled state in the first storage device, and triggers by means of a second selection signal the storage of n control bits that represent the lower state of the settled state in the second storage device.

In accordance with a further preferred embodiment of the inventive circuit, the first regulating signal is formed by the present state of the n control bits of the first control signal generating circuit and the second regulating signal is formed by the present state of the n control bits of the second control signal generating circuit.

In accordance with a further preferred embodiment of the inventive circuit, the first control signal generating circuit and the second control signal generating circuit in each case have a multiplexer, which, on the input side, is connected to n first storage device lines of the first storage device and to n second storage device lines of the second storage device and, on the output side, is connected to the n input/output drivers by means of driver control lines.

In accordance with a further preferred embodiment of the inventive circuit, the detection circuit of the first control signal generating circuit receives the reference voltage, the pull-down driver voltage and the first compensation signal and generates therefrom a third selection signal for controlling the multiplexer, so that the multiplexer, depending on the third selection signal, transfers the control bits buffer-stored in the first storage device or the control bits buffer-stored in the second storage device as first control signal onto the driver control lines.

In accordance with a further preferred embodiment of the inventive circuit, the detection circuit of the second control signal generating circuit receives the reference voltage, the pull-up driver voltage and the second compensation signal and generates therefrom the third selection signal for controlling the multiplexer, so that the multiplexer, depending on the third selection signal, transfers the control bits buffer-stored in the first storage device or the control bits buffer-stored in the second storage device as second control signal onto the driver control lines.

In accordance with a further preferred embodiment of the inventive circuit, the automatic state machine is clocked with a clock signal, the first storage device is clocked with a first clock signal derived from the clock signal, and the second storage device is clocked with a second clock signal derived from the clock signal.

DESCRIPTION OF THE PREFERRED EMBODIMENTS

Identical or functionally identical elements and signals—unless specified otherwise—have been provided with the same reference symbols in all the figures.

Although the present invention is described below with regard to calibration circuits and driver control circuits, it is not restricted thereto, but rather can be used in diverse ways.

Figure 1:
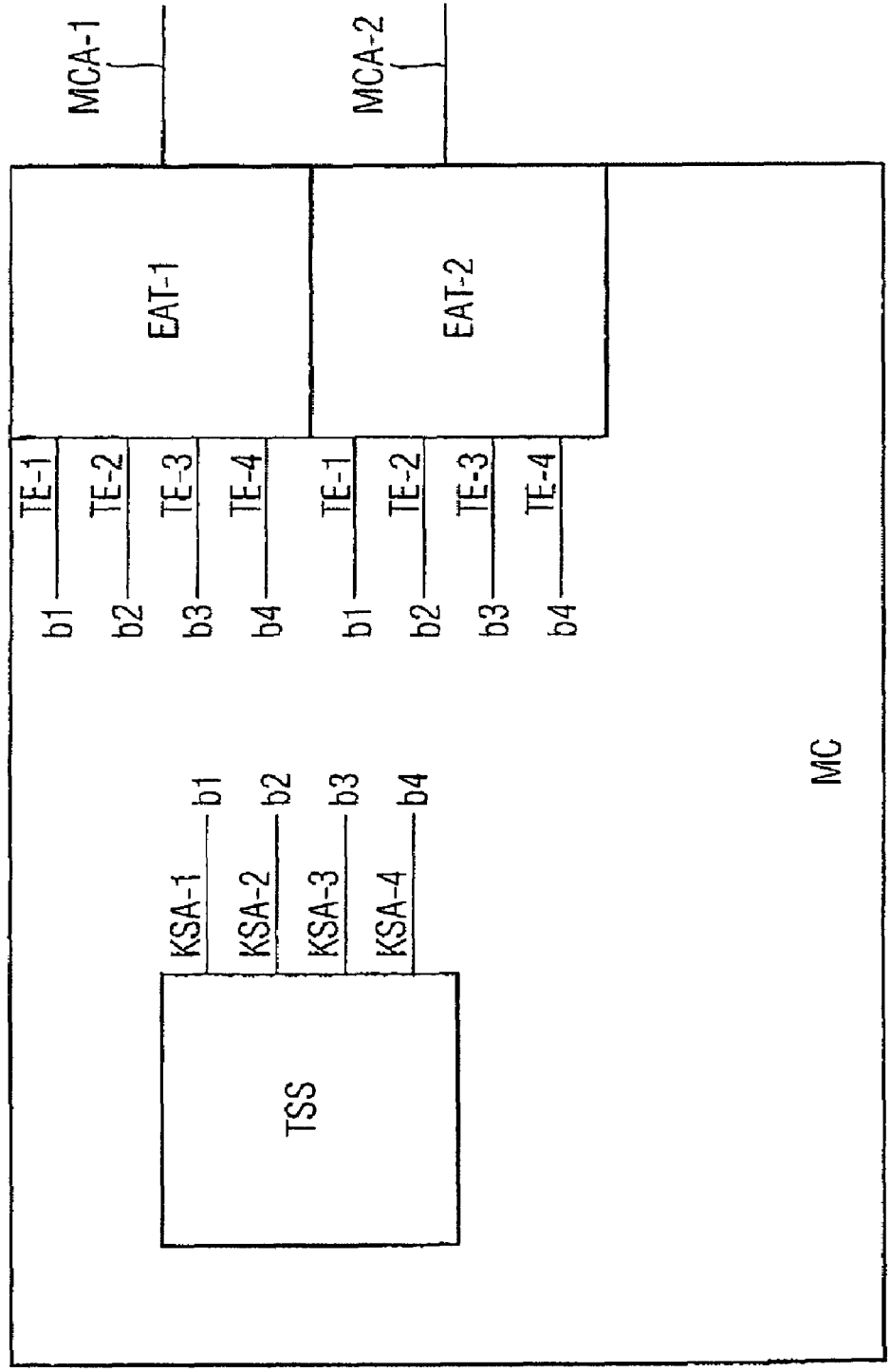
FIG. 1 as discussed above is a schematic block diagram of a microchip with a known driver control circuit for controlling the input/output drivers.
Figure 2:
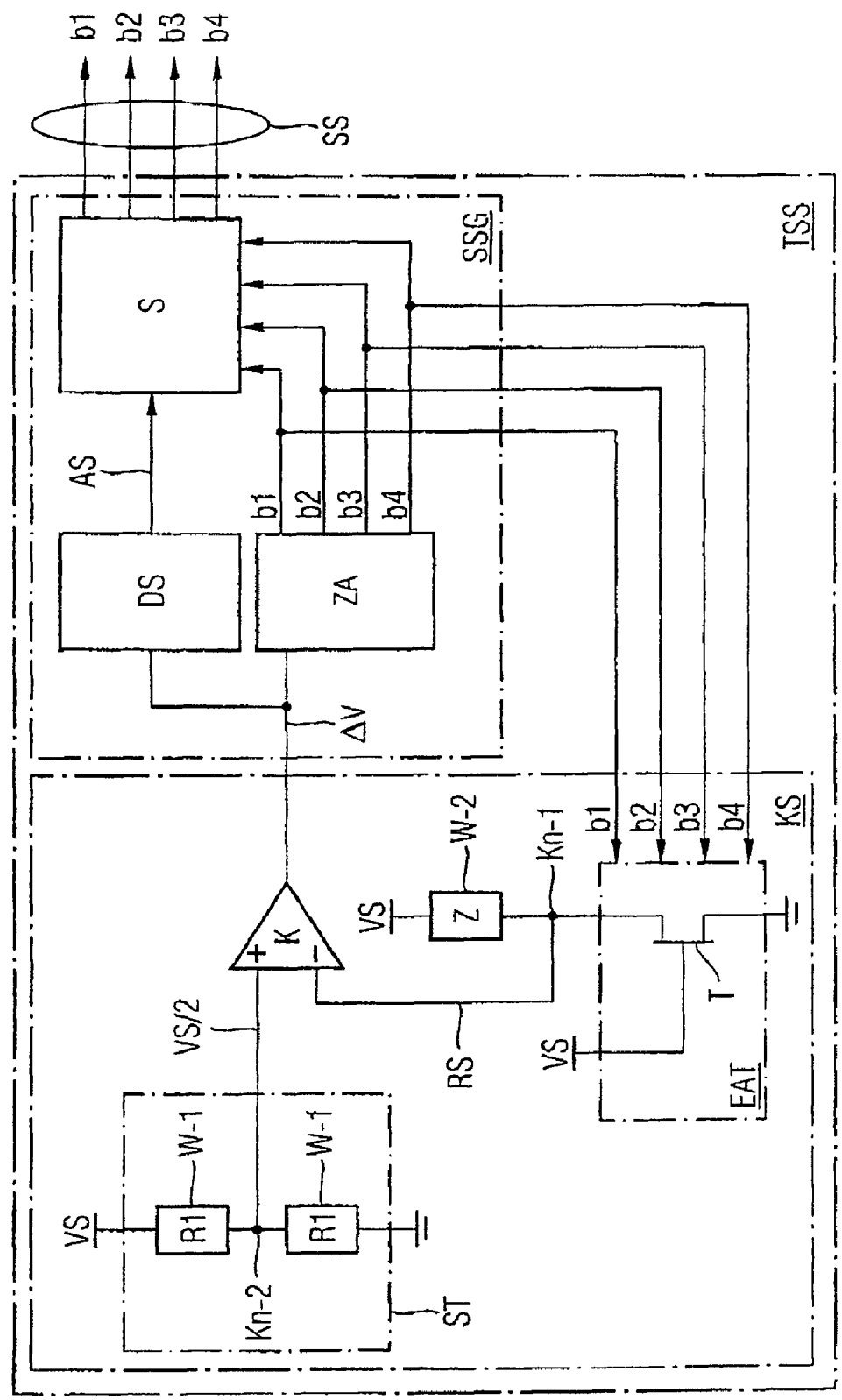
FIG. 2 as discussed above is a schematic block diagram of the known driver control circuit.
Figure 3:
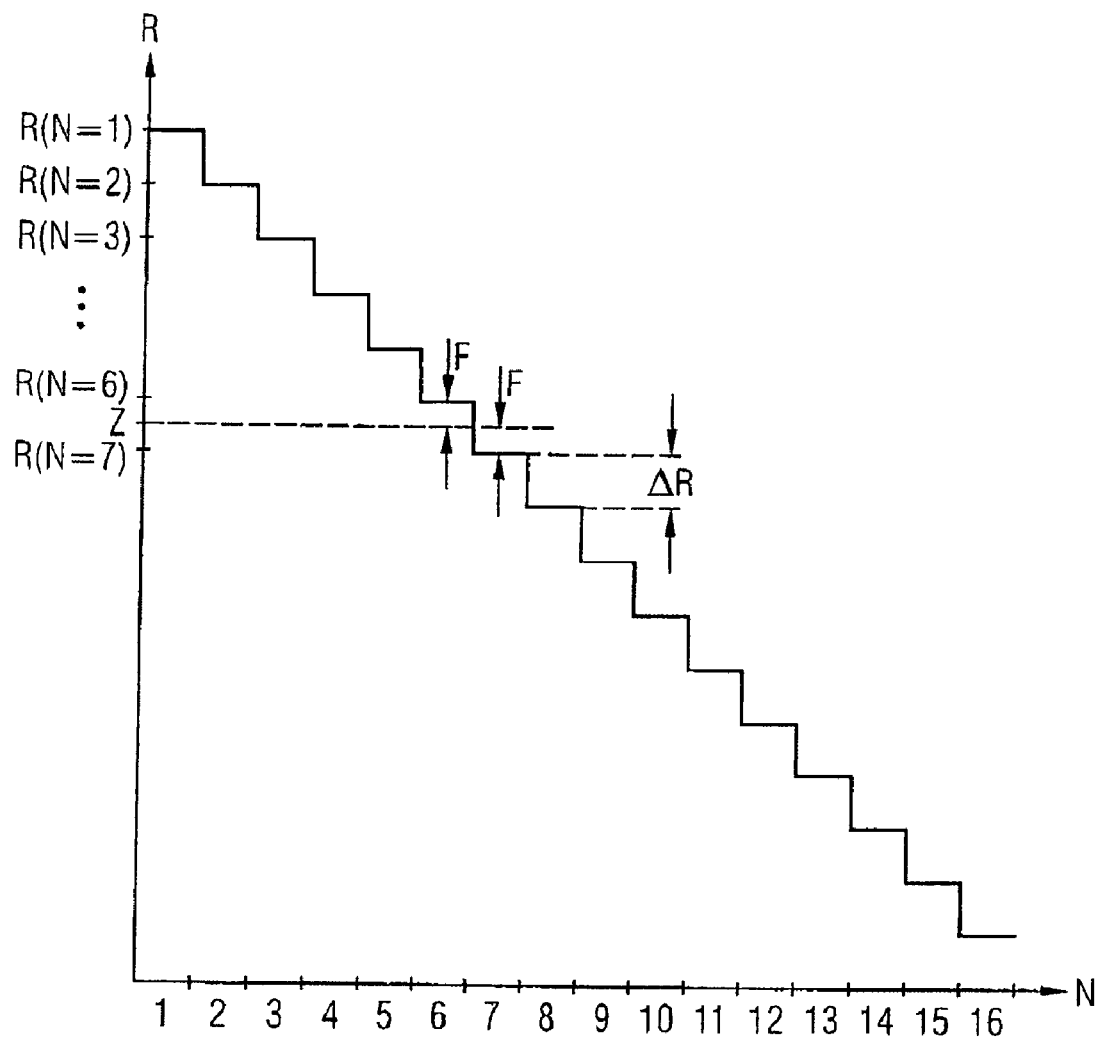
FIG. 3 as discussed above is a schematic diagram for illustrating the regulation error produced by the known driver control circuit.
Figure 4:
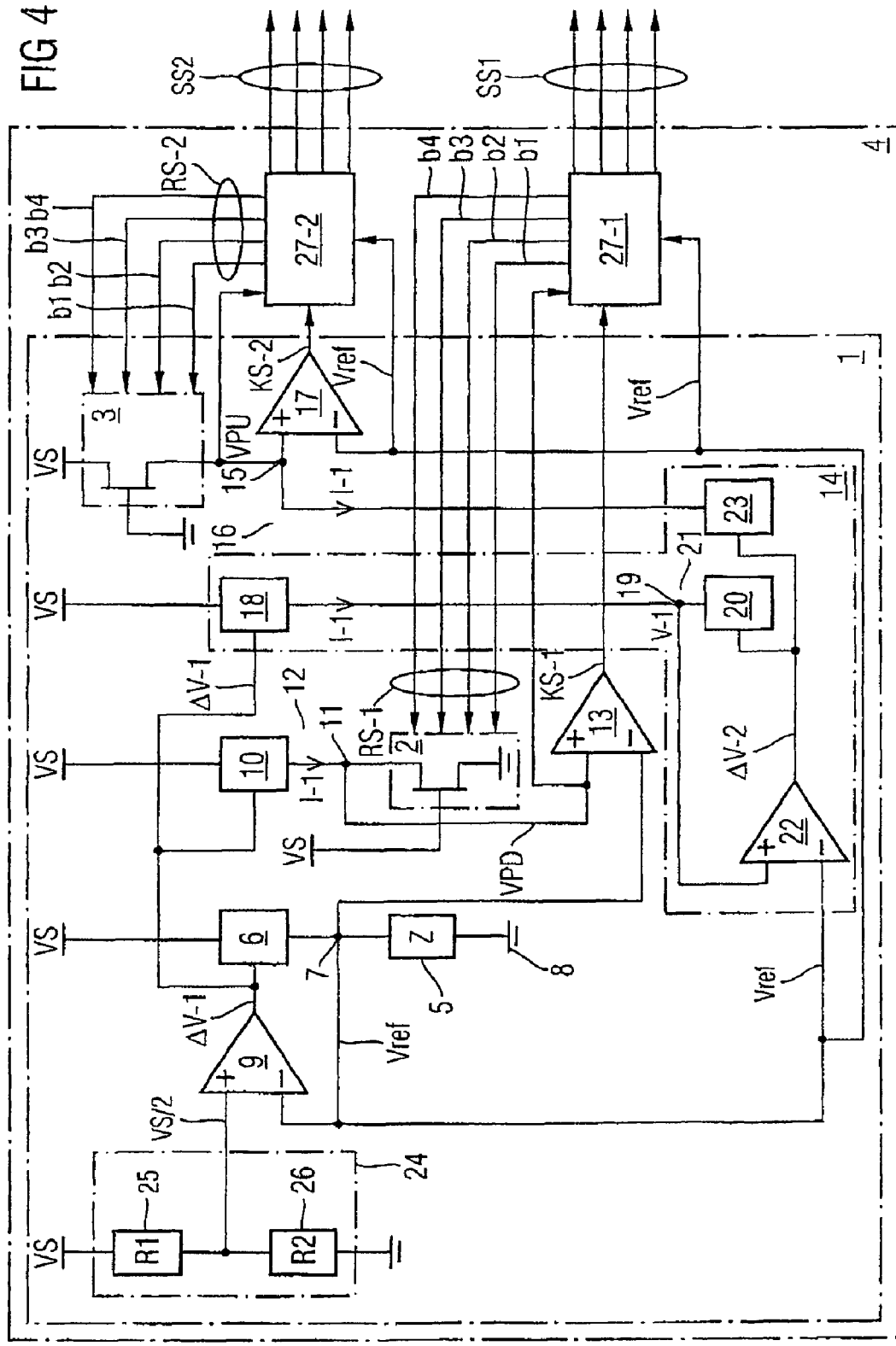
FIG. 4 as discussed above is a schematic block diagram of a preferred exemplary embodiment of a driver control circuit with a calibration circuit according to the present invention.

FIG. 4 shows a schematic block diagram of a preferred exemplary embodiment of a driver control circuit with a calibration circuit according to the present invention. The driver control circuit 4 has a calibration circuit 1, a first control signal generating circuit 27-1 and a second control signal generating circuit 27-2.

The calibration circuit 1 regulates a first calibration signal KS-1 for a pull-down driver 2 and a second calibration signal KS-2 for a pull-up driver 3 in such a way that the calibration error of the corresponding calibration signal is reduced in each case. The regulating error of the driver control circuit 4 is minimized by virtue of the reduced calibration error, so that the input/output drivers controlled by the driver control circuit 4 control the connected microchip output lines in such a way that noise on the microchip output lines is minimized during a transmission of the signals by the input/output drivers.

The calibration circuit 1 has an external resistor 5 having a resistance value Z like the output line of the integrated circuit. It is a particular advantage of the invention that only a single external resistor 5 is used for controlling the pull-down driver 2 and the pull-up driver 3.

The calibration circuit 1 furthermore has a first voltage/current converter 6, which is connected to the external resistor 5 by means of a first node 7. The first voltage/current converter 6 is connected to a supply voltage VS and the external resistor 5 is connected to earth 8, so that a reference voltage Vref is dropped across the first node 7.

The calibration circuit 1 furthermore has a first comparator 9, which compares the reference voltage Vref with half the supply voltage VS/2 in order to provide a first amplified differential voltage ΔV-1 on the output side, the first voltage/current converter 6 converting the first amplified voltage difference ΔV-1 into a first current I-1, so that the first voltage/current converter 6 regulates the reference voltage Vref to half the supply voltage VS/2.

The calibration circuit 1 furthermore has a second voltage/current converter 10, which is connected to the pull-down driver 2 via a second node 11. The second voltage/current converter 10 converts the first amplified differential voltage ΔV-1 into the first current I-1 in order to set a pull-down driver voltage VPD to half the supply voltage VS/2.

The calibration circuit 1 furthermore has a second comparator 13, which compares the reference voltage Vref with the pull-down driver voltage VPD in order to provide the first calibration signal KS-1 on the output side.

The calibration circuit 1 furthermore has a voltage/current converter circuit 14. The voltage/current converter circuit 14 is connected to the pull-up driver 3 via a third node 15 and converts the first amplified differential voltage ΔV-1 into the negative first current I-1 in order to set a pull-up driver voltage VPU to half the supply voltage VS/2.

Preferably, the voltage/current converter circuit 14 has a third voltage/current converter 18, a fourth comparator 22 and a fifth voltage/current converter 22. The third voltage/current converter 18 is connected to the supply voltage VS and, via a fourth node 19, to an earthed fourth voltage/current converter 20, so that a first voltage V-1 is dropped across the fourth node 19. The fourth comparator 22 compares the reference voltage Vref with the first voltage V-1 in order to provide a second amplified differential voltage ΔV/2 on the output side, the fourth voltage/current converter 20 receiving the second amplified differential voltage ΔV/2 on the input side and thus setting the first voltage V-1 to half the supply voltage VS/2. The fifth voltage/current converter 23, which has an identical voltage/current conversion characteristic to the fourth voltage/current converter 20, receives the second amplified differential voltage ΔV/2 and converts the latter into the negative first current I-1.

The calibration circuit 1 furthermore has a third comparator 17, which compares the reference voltage Vref with the pull-up driver voltage VPU in order to provide the second calibration signal KS-2 on the output side.

In particular, the first current I-1 flows from the second voltage/current converter 10 into the second node 11 and from the fifth voltage/current converter 23 into the third node.

Preferably, the first voltage/current converter 6, the second voltage/current converter 10 and the third voltage/current converter 18 have an identical voltage/current conversion characteristic.

Preferably, half the supply voltage VS/2 is provided by means of a fourth voltage divider 24 provided in the calibration circuit 1. The fourth voltage divider 24 has a first resistor 25 and a second resistor 26 having identical resistance values R1, R2.

A first voltage divider 12 is thus formed by the second voltage/current converter 10 and the pull-down driver 2. A second voltage divider 16 is formed by the voltage/current converter circuit 14 and the pull-up driver 3. A third voltage divider 21 is formed by the third voltage/current converter 18 and the fourth voltage/current converter 20.

Figure 5:
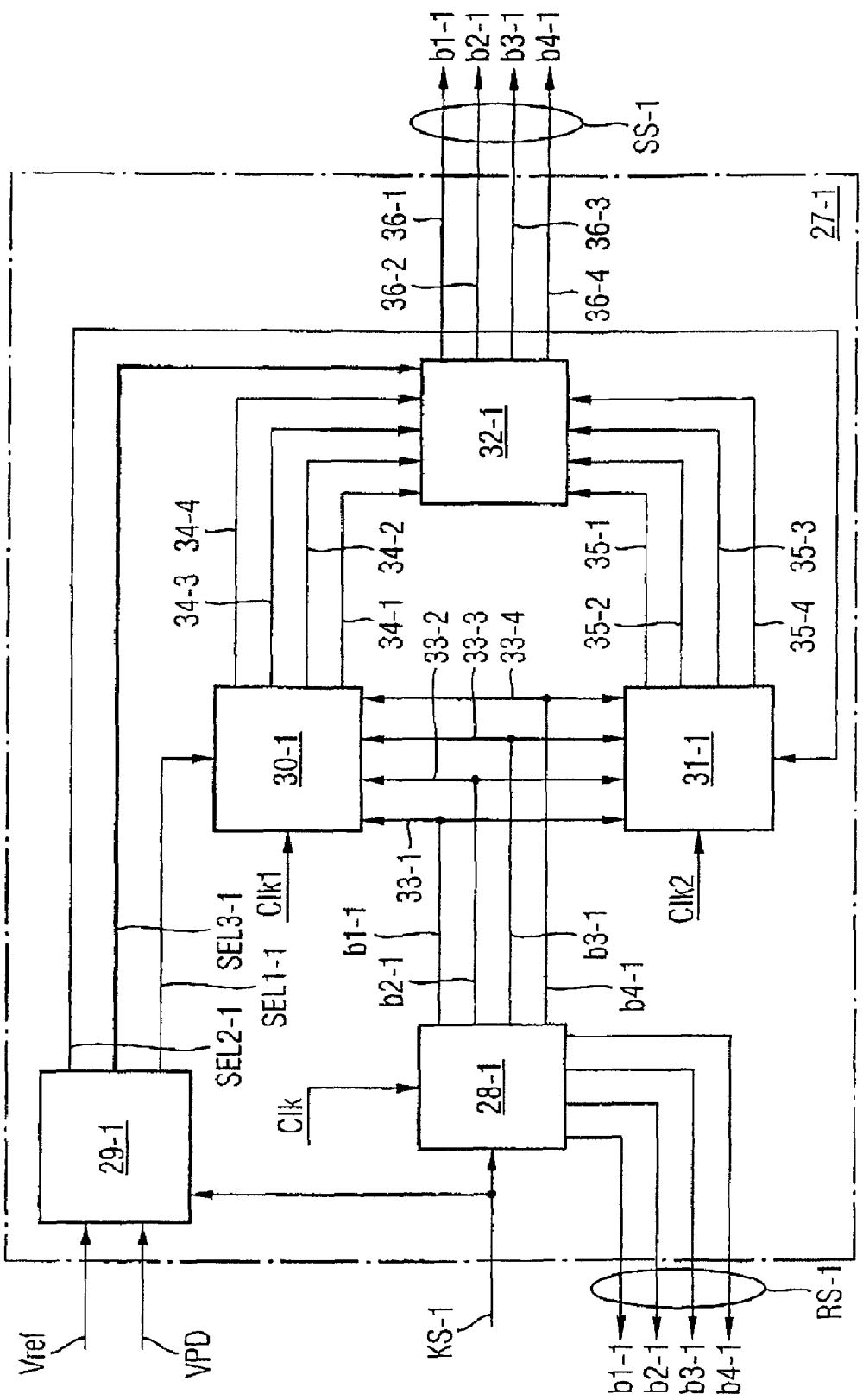
FIG. 5 as discussed above is a schematic block diagram of a preferred exemplary embodiment of a first control signal generating circuit of the driver control circuit according to the invention as shown in FIG. 4.
Figure 6:
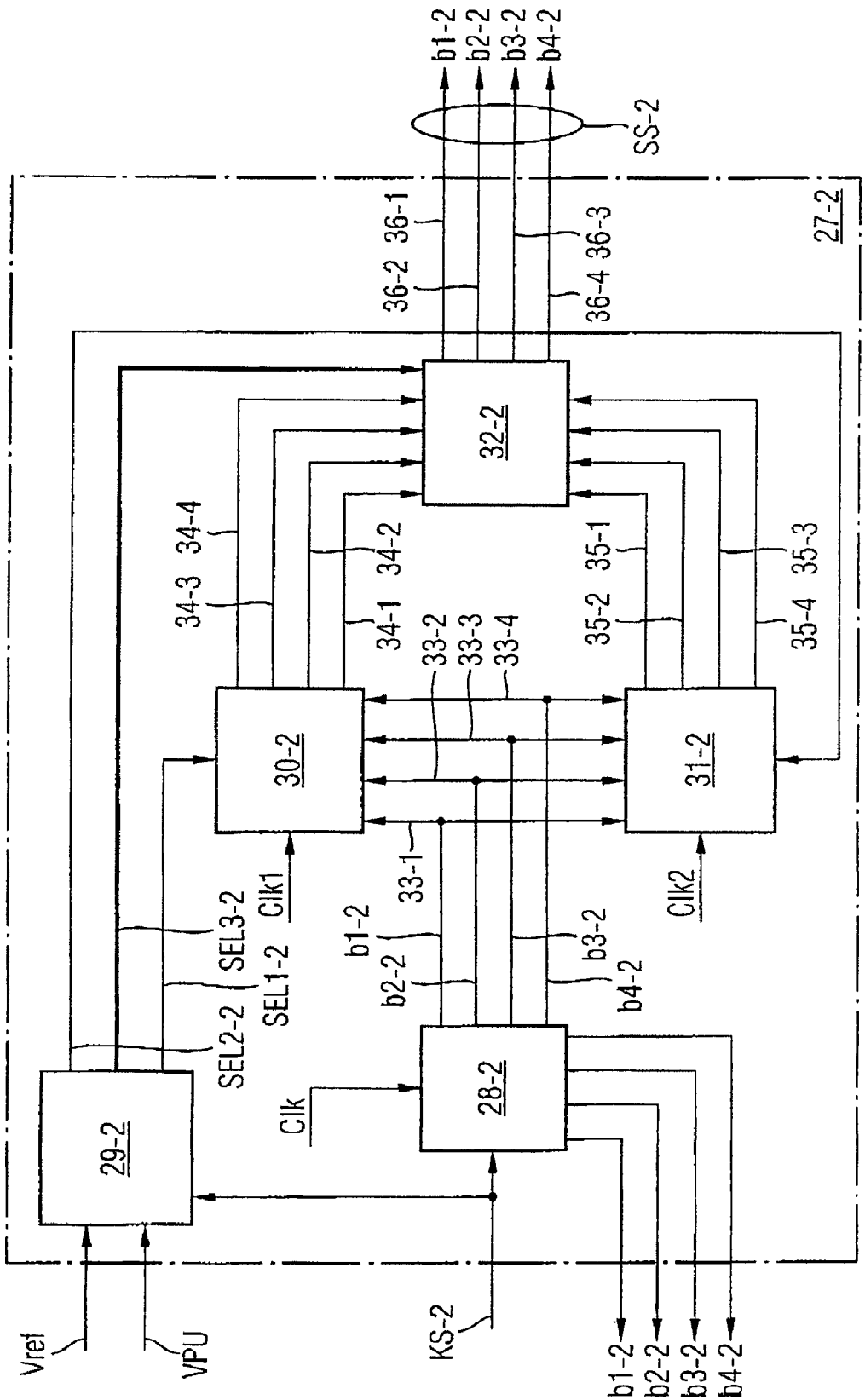
FIG. 6 as discussed above is a schematic block diagram of a preferred exemplary embodiment of a second control signal generating circuit of the driver control circuit according to the invention as shown in FIG. 4.

FIG. 5 shows a schematic block diagram of a preferred exemplary embodiment of the first control signal generating circuit 27-1, and FIG. 6 shows a schematic block diagram of a preferred exemplary embodiment of the second control signal generating circuit 27-2 of the driver control circuit 4 according to the invention as shown in FIG. 4.

The structure of the first control signal generating circuit 27-1 and of the second control signal generating circuit 27-2 correspond to one another, but the two control signal generating circuits 27-1, 27-2 receive and process different input signals and provide different signals on the output side.

The first control signal generating circuit 27-1 and the second control signal generating circuit 27-2 in each case have an automatic state machine 28-1, 28-2, which, on the input side, receives the corresponding calibration signal KS-1, KS-2 and, on the output side, depending on the corresponding calibration signal KS-1, KS-2, provides one of its $2^n$ predefined states by means of n control lines 33-1, . . . , 33-4, the automatic state machine 28-1, 28-2 providing, on each of the n control lines 33-1, . . . , 33-4, precisely one control bit b1-1, . . . , b4-1; b1-2, . . . , b4-2 according to the present state of the $2^n$ states.

The automatic state machine 28-1, 28-2 assumes the next higher state if the calibration signal KS-1, KS-2 is positive. The automatic state machine 28-1, 28-2 assumes the next lower state if the calibration signal KS-1, KS-2 is negative.

The first control signal generating circuit 27-1 and the second control signal generating circuit 27-2 in each case have a detection circuit 29-1, 29-2, which detects a settled state of the automatic state machine 28-1, 28-2 by means of the calibration signal KS-1, KS-2.

Furthermore, the first control signal generating circuit 27-1 and the second control signal generating circuit 27-2 in each case have a first storage device 30-1, 30-2 and a second storage device 31-1, 33-2, both the first storage device 30-1, 30-2 and the second storage device 31-1, 31-2 being connected to the n control lines 33-1, . . . , 33-4.

The detection circuit 29-1, 29-2, in the case of the detection of the settled state, triggers by means of a first selection signal SEL1-1, SEL1-2 the storage of n control bits b1-1, ..., b4-1; b1-2, ..., b4-2 that represent the higher state of the settled state in the first storage device 30-1, 30-2. The detection circuit 29-1, 29-2, in the case of the detection of the settled state, triggers by means of a second selection signal SEL2-1, SEL2-2 the storage of n control bits b1-1, ..., b4-1; b1-2, ..., b4-2, that represent the lower state of the settled state in the second storage device 33-1, 33-2.

The first regulating signal RS-1 is formed by the present state of the n control bits b1-1, ..., b4-1 of the first control signal generating circuit 27-1 and the second regulating signal RS-2 is formed by the present state of the n control bits b1-2, ..., b4-2 of the second control signal generating circuit 27-2.

Furthermore, the first control signal generating circuit 27-1 and the second control signal generating circuit 27-2 in each case have a multiplexer 31-1, 31-2. On the input side, the multiplexer 31-1, 31-2 is connected to n (here: n=4) first storage device lines 34-1, 34-4 of the first storage device 30-1, 30-2 and to n second storage device lines 35-1, 35-4 of the second storage device 31-1, ..., 31-4. On the output side, the multiplexer 31-1, 31-2 is connected to the n input/output drivers by means of driver control lines 36-1, ..., 36-4.

Preferably, the detection circuit 29-1 of the first control signal generating circuit 27-1 in accordance with FIG. 5 receives the reference voltage Vref, the pull-down driver voltage VPD and the first compensation signal KS-1 and generates therefrom a third selection signal SEL3-1. The third selection signal SEL3-1 serves for controlling the multiplexer 32-1, so that the multiplexer 32-1, depending on the third selection signal SEL3-1, transfers the control bits b1-1, ..., b4-1 buffer-stored in the first storage device 30-1 or the control bits b1-1, ..., b4-1 buffer-stored in the second storage device 31-1 as first control signal SS-1 onto the driver control lines 36-1, ..., 36-4.

The detection circuit 29-2 of the second control signal generating circuit 27-2 in accordance with FIG. 6 preferably receives the reference voltage Vref, the pull-up driver voltage VPU and the second compensation signal KS-2 and generates therefrom the third selection signal SEL3-2 therefrom. The third selection signal SEL3-2 serves for controlling the multiplexer 32-3, so that the multiplexer 32-2, depending on the third selection signal SEL3-2, transfers the control bits b1-2, ..., b4-2 buffer-stored in the first storage device 30-2 or the control bits b1-2, ..., b4-2 buffer-stored in the second storage device 31-2 as second control signal SS-2 onto the driver control lines 36-1, ..., 36-4.

Preferably, in each control signal generating circuit 27-1, 27-2, the automatic state machine 28-1, 28-2 is clocked with a clock signal Clk, the first storage device 30-1, 30-2 is clocked with a first clock signal Clk1 derived from the clock signal Clk, and the second storage device 31-1, 31-2 is clocked with a second clock signal Clk2 derived from the clock signal Clk.

Figure 7:
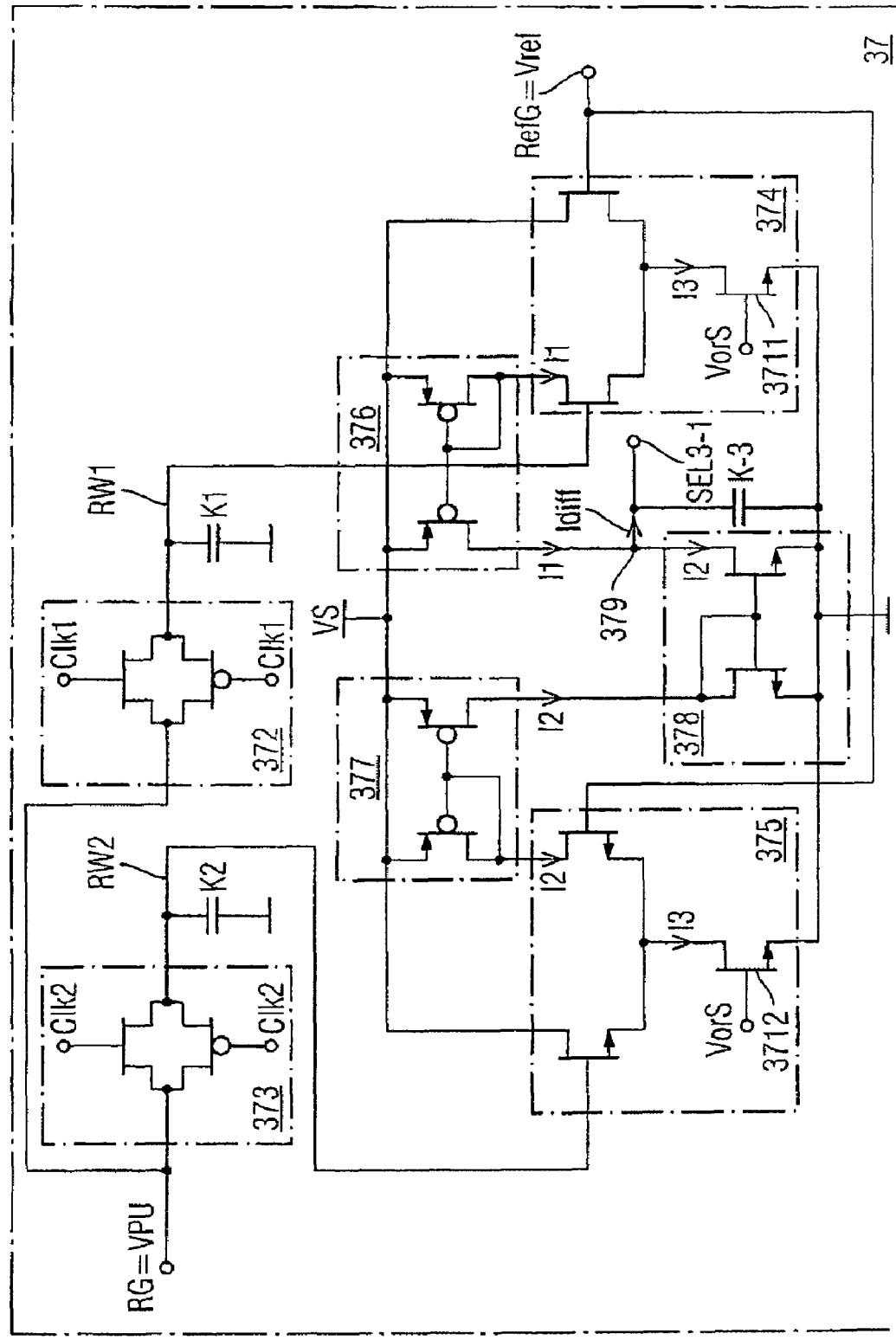
FIG. 7 as discussed above is a schematic block diagram of an exemplary embodiment of a multiplexer control circuit for a detection circuit according to the present invention.

An explanation is given below of how the detection circuit 29-1, 29-2 generates the third selection signal SEL3-1, SEL3-2 from the pull-down driver voltage VPD or respectively the pull-up driver voltage VPU and the reference voltage. For this purpose, a multiplexer control circuit 37 is provided in each detection circuit 29-1, 29-2. The multiplexer control circuit 37 for the detection circuit 29-1 of the first control signal generating circuit 27-1 is to be explained below. In regard thereto, FIG. 7 shows a schematic block diagram of an exemplary embodiment of a multiplexer control circuit 37 for the detection circuit 29-1. The multiplexer control circuit 37 receives, on the input side, the reference voltage Vref as reference quantity RefG and the pull-down driver voltage VPU as regulation quantity RG and generates therefrom the third selection signal SEL3-1.

In the settled state, the regulation quantity RG oscillates between a first regulation value RW1 and a second regulation value RW2.

The multiplexer control circuit 37 has a first transfer gate 370 for providing the first regulation value RW1, which is buffer-stored in the first storage device 30-1 and is formed by the four presently stored control bits b1-1, ..., b4-1. The first transfer gate 372 receives the regulation quantity RG on the input side and provides the first regulation value RW1 on the output side. The first transfer gate 372 is clocked with a first clock signal Clk1, which, like the regulation quantity RG, has the first period duration T.

Furthermore, the multiplexer control circuit 37 has a second transfer gate 373 for providing the second regulation value RW2, which is buffer-stored in the second storage device 30-2. The second transfer gate 373 receives the regulation quantity RG on the input side and provides the second regulation value RW2 on the outside side. The second transfer gate 373 is clocked with a second clock signal Clk2, which has the first period duration T and is phase-shifted by half a first period duration T/2 relative to the first clock signal Clk1.

Preferably, the regulation quantity RG, the first regulation value RW1 and the second regulation value RW2 are in each case formed as a voltage.

The multiplexer control circuit 37 furthermore has a first differential circuit 374, which provides a first current I1, which is directly proportionally dependent on a difference between the first regulation value RW1 and the reference quantity RefG. The first differential circuit 374 has a bias voltage transistor 3711, so that a reference current I3 is provided for the first current I1. The equation for the first current I1 accordingly emerges as follows:

$$1)\ I1 = \frac{I3}{2} + k\,(RW1 - RefG),$$

where k is a proportionality constant.

The multiplexer control circuit 37 furthermore has a second differential circuit 375, which provides a second current I2, which is directly proportionally dependent on a difference between the second regulation value RW2 and the reference quantity RefG. The second differential circuit 375 has a bias voltage transistor 3712, so that a reference current I3 identical to that for the first current I1 is provided for the second current I2. Accordingly, the equation below for the second current I2 emerges as follows:

$$2)\ I2 = \frac{I3}{2} + k\,(RefG - RW2).$$

The bias voltage transistors 3711, 3712 are in each case operated with a bias voltage VorS. The multiplexer control circuit 37 furthermore has a first current mirror circuit 376 connected between the first differential circuit 374 and a first node 379 in order to pass the first current I1 to the first node 379. The first current mirror surface 376 is preferably formed as an npn current mirror circuit.

The circuit 1 furthermore has a second current mirror circuit 377 and a third current mirror circuit 378 connected in series with the second current mirror circuit 377, which are connected between the second differential circuit 375 and the first node 379 in order to pass the second current I2 to the first node 379. Preferably, the second current mirror circuit 377 is formed as an npn current mirror circuit and the third current mirror circuit 378 is formed as a pnp current mirror circuit.

The multiplexer control circuit 37 furthermore has the first node 379, at which a differential current Idiff between the first current I1 and the second current I2 is formed. The differential current Idiff forms the selection signal sel3-1, which specifies whether the first regulation value RW1 or the second regulation value RW2 is to be chosen for minimizing the regulation difference.

Potential disturbing offset currents are eliminated by means of the identical reference current I3 in the case of forming the difference between the first current I1 and the second current I2.

The calculation of the differential current Idiff results from the difference between equations (1) and (2):

$$Idiff = I1 - I2 \quad (3)$$
$$= \frac{I3}{2} + k(RW1 - RefG) - \left[\frac{I3}{2} + k(RefG - RW2)\right]$$
$$Idiff = RW1 + RW2 - 2RefG$$

The following relationship results for the differential current Idiff:

$$Idiff > 0 \rightarrow RW1 + RW2 - 2RefG > 0 \rightarrow \frac{RW1 + RW2}{2} > Vref \quad (4)$$

With the following definition of a mean value MW, the decision with regard to the regulation value is made clearer.

$$\frac{RW1 + RW2}{2} = MW \quad (5)$$

If the differential current Idiff is greater than 0 (cf. equations (4) and (5)), then the mean value MW is also greater than the reference quantity RefG. Consequently, the selection signal SEL3-1 is to be set e.g. to 1 and the first regulation value RW1 is to be chosen as the regulation value. However, if the differential current Idiff is less than 0, then the mean value MW is less than the reference quantity RefG, and the selection signal SEL3-1 is to be set to 0 according to the above example. Consequently, the second regulation value RW2 is to be chosen. The following relationship may be represented more concisely by the algorithm below:

IF Idiff>0     (6)

THEN MW>RefG→SEL3-1=1→RW1
ELSE MW<RefG→SEL3-2=0→RW2

The multiplexer control circuit 37 thus provides the selection signal SEL3-1 that is used to select which of the two regulation values RW1, RW2 is to be selected in order to minimize the regulating difference.

Although modifications and changes may be suggested by those skilled in the art, it is the intention of the inventors to embody within the patent warranted heron all changes and modification as reasonably and properly come within the scope of their contribution to the art.

We claim as our invention:

1. A calibration circuit of a driver control circuit controlling a plurality of input/output drivers of an integrated circuit, comprising:
    an external resistor having a resistance corresponding to the resistance of an output line of said integrated circuit; said external resistor having a first terminal and a second terminal which is connected to ground;
    a first voltage/current converter being connected to said first terminal of said external resistor forming a first node and being connected to a supply voltage, so that a reference voltage in respect to ground appears at said first node;
    a first comparator configured to compare said reference voltage with a voltage having half the value of said supply voltage in order to generate a first amplified differential voltage which is converted by said first voltage/current converter into a first current, so that said first voltage/current converter regulates the reference voltage to half the value of said supply voltage;
    a second voltage/current converter, which is connected via a second node to a pull-down driver and converts said first amplified differential voltage into a second current being substantially identical to said first current, in order to set the pull-down driver voltage of said pull-down driver to half the supply voltage;
    a second comparator comparing said reference voltage with said pull-down driver voltage in order to provide a first calibration signal at the output of said second comparator;
    a voltage/current converter circuit, which is connected to a pull-up driver via a third node and converts said first amplified differential voltage into a third current having the negative value of said first current, in order to set the pull-up driver voltage of said pull-up driver to half the value of said supply voltage; and
    a third comparator, which compares said reference voltage with said pull-up driver voltage in order to provide a second calibration signal at the output of said third comparator.

2. The circuit of claim 1, wherein said voltage/current converter circuit comprises:
    a third voltage/current converter, which is connected to said supply voltage and, via a fourth node, to a fourth voltage/current converter being connected to ground, so that a first voltage in respect to ground appears at said fourth node;
    a fourth comparator comparing said reference voltage with said first voltage in order to provide a second amplified differential voltage at the output of said fourth comparator; said fourth current/voltage converter receiving said second amplified differential voltage at its input and thus setting said first voltage to half the value of said supply voltage; and
    a fifth voltage/current converter whose voltage/current conversion characteristic is substantially identical to that of said fourth voltage/current converter; said fifth voltage/current converter receiving said second amplified differential voltage and converting said second amplified differential voltage into said third current.

3. The circuit of claim 1, wherein said second current flows from said second voltage/current converter into said second node and the negative of said third current flows from said fifth voltage/current converter into said third node.

4. The circuit of claim 1, wherein said first voltage/current converter, said second voltage/current converter and said third voltage/current converter have substantially identical voltage/current conversion characteristics.

5. The circuit of claim 1, wherein half the value of said supply voltage is generated by a voltage divider having a first resistor and a second resistor having substantially identical resistance values.

6. A Driver control circuit, comprising:
an external resistor having a resistance corresponding to the resistance of an output line of said integrated circuit; said external resistor having a first terminal and a second terminal which is connected to ground;
a first voltage/current converter being connected to said first terminal of said external resistor forming a first node and being connected to a supply voltage, so that a reference voltage in respect to ground appears at said first node;
a first comparator configured to compare said reference voltage with a voltage having half the value of said supply voltage in order to generate a first amplified differential voltage which is converted by said first voltage/current converter into a first current, so that said first voltage/current converter regulates the reference voltage to half the value of said supply voltage;
a second voltage/current converter, which is connected via a second node to a pull-down driver and converts said first amplified differential voltage into a second current being substantially identical to said first current, in order to set the pull-down driver voltage of said pull-down driver to half the supply voltage;
a second comparator comparing said reference voltage with said pull-down driver voltage in order to provide a first calibration signal at the output of said second comparator;
a voltage/current converter circuit, which is connected to a pull-up driver via a third node and converts said first amplified differential voltage into a third current having the negative value of said first current, in order to set the pull-up driver voltage of said pull-up driver to half the value of said supply voltage;
a third comparator, which compares said reference voltage with said pull-up driver voltage in order to provide a second calibration signal at the output of said third comparator;
a first control signal generating circuit, which receives said reference voltage, said first calibration signal, and said pull-down driver voltage, in order to generate a first regulating signal and a first control signal; said first regulating signal regulating said pull-down driver voltage to said reference voltage and said first control signal controlling pull-down drivers of a plurality of input/output drivers of an integrated circuit; and
a second control signal generating circuit, which receives said reference voltage, said second calibration signal, and said pull-up driver voltage, in order to generate a second regulating signal and a second control signal; said second regulating signal regulating said pull-up driver voltage to said reference voltage and said second control signal controlling pull-up drivers of a plurality of pull-up drivers of said input/output drivers.

7. The circuit of claim 6, wherein said first control signal generating circuit comprises a first automatic state machine and a plurality of first control lines connected to the outputs of said first automatic state machine; said first automatic state machine having a first plurality of predetermined states, being configured to receive said first calibration signal, and being configured to provide exactly one control bit of a first plurality of control bits on each of said first control lines depending on said first calibration signal according to the current state of said first plurality of predetermined states, and wherein said second control signal generating circuit comprises a second automatic state machine and a plurality of second control lines connected to the outputs of said second automatic state machine; said second automatic state machine having a second plurality of predetermined states, being configured to receive said second calibration signal, and being configured to provide exactly one control bit of a second plurality of control bits on each of said second control lines depending on said second calibration signal according to the current state of said second plurality of predetermined states.

8. The circuit of claim 7, wherein said first automatic state machine switches to the next higher state if said first calibration signal is positive, and switches to the next lower state if said first calibration signal is negative, and said second automatic state machine switches to the next higher state if said second calibration signal is positive, and switches to the next lower state if said second calibration signal is negative.

9. The circuit of claim 7, wherein said first control signal generating circuit comprises a first detection circuit detecting a settled state of said first automatic state machine in response to said first calibration signal and said second control signal generating circuit comprises a second detection circuit detecting a settled state of said second automatic state machine in response to said second calibration signal.

10. The circuit of claim 9, wherein said first control signal generating circuit comprises a first memory device and a second memory device which are connected to said plurality of first control lines, and said second control signal generating circuit comprises a third memory device and a fourth memory device which are connected to said plurality of second control lines.

11. The circuit of claim 10, wherein said first detection circuit triggers with a first selection signal the storage of said first plurality of control bits representing the higher state of said first automatic state machine in said first memory device, and triggers with a second selection signal the storage of said first plurality of control bits representing the lower state of said settled state of said first automatic state machine in said second memory device, if said first detection circuit detects a settled state of said first automatic state machine, and wherein said second detection circuit triggers with a third selection signal the storage of said second plurality of control bits representing the higher state of said second automatic state machine in said third memory device, and triggers with a fourth selection signal the storage of said second plurality of control bits representing the lower state of said settled state of said second automatic state machine in said fourth memory device, if said second detection circuit detects a settled state of said second automatic state machine.

12. The circuit of claim 7, wherein said first regulating signal is formed by the present state of said first plurality of control bits of said first control signal generating circuit and said second regulating signal is formed by the present state of second said plurality of control bits of said second control signal generating circuit.

13. The circuit of claim 10, wherein said first control signal generating circuit comprises a first multiplexer, whose inputs are connected to said first memory device through a first plurality of memory device lines and to said second memory device through a second plurality of memory device lines; the outputs of said first multiplexer being connected to said input/output drivers of said integrated circuit by said first plurality of driver control lines, and wherein said second control signal generating circuit comprises a second multiplexer, whose inputs are connected to said third memory device through a third plurality of memory device lines and to said fourth memory device through a fourth plurality of memory device lines; the outputs of said second multiplexer being connected to said input/output drivers of said integrated circuit by said second plurality of driver control lines.

14. The circuit of claim 13, wherein said first detection circuit is configured to receive said reference voltage, said pull-down driver voltage, and said first calibration signal and said first detection circuit is configured to generate, dependent on said received said reference voltage, said pull-down driver voltage, and said first calibration signal a third selection signal for controlling said first multiplexer, so that said first multiplexer, depending on said third selection signal, transfers to said first plurality of control lines as said first control signal either said first plurality of control bits stored in said first memory device or stored in said second memory device.

15. The circuit of claim 13, wherein said second detection circuit is configured to receive said reference voltage, said pull-up driver voltage, and said second calibration signal and said second detection circuit is configured to generate, dependent on said received said reference voltage, said pull-up driver voltage, and said second calibration signal a fourth selection signal for controlling said second multiplexer, so that said second multiplexer, depending on said fourth selection signal, transfers to said second plurality of control lines as said second control signal either said second plurality of control bits stored in said third memory device or stored in said fourth memory device.

16. The circuit of claim 10, wherein said first and second automatic state machines are clocked with a first clock signal, said first memory device is clocked with a second clock signal derived from said first clock signal, said second memory device is clocked with a third clock signal derived from said second clock signal, said third memory device is clocked with a fourth clock signal derived from said first clock signal, and said fourth memory device is clocked with a fifth clock signal derived from said fourth clock signal.

* * * * *